United States Patent [19]

Werrbach

[11] Patent Number: 5,896,458
[45] Date of Patent: Apr. 20, 1999

[54] STICKY LEVELER

[75] Inventor: Donn R. Werrbach, Glendale, Calif.

[73] Assignee: Aphex Systems, Ltd., Sun Valley, Calif.

[21] Appl. No.: 08/804,802

[22] Filed: Feb. 24, 1997

[51] Int. Cl.[6] .................................................. H03G 3/00
[52] U.S. Cl. ............................................ 381/108; 381/107
[58] Field of Search .................................. 381/106, 107, 381/108; 333/14

[56] References Cited

U.S. PATENT DOCUMENTS 4,071,695  1/1978  Flanagan et al. .
4,455,676  6/1984  Kaneda ................................. 381/106
4,685,136  8/1987  Latshaw ................................ 381/27
5,615,256  3/1997  Yamashita ............................. 381/107

*Primary Examiner*—Vivian Chang
*Attorney, Agent, or Firm*—Thomas I. Rozsa; Tony D. Chen; Jerry Fong

[57] ABSTRACT

A sticky leveler utilizing a window detection technique to preserve the relatively small level changes of an audio signal. The sticky leveler includes a voltage controlled amplifier (VCA) and a sticky detector, where an input signal is received by the VCA for creating a variable gain path to the VCA output. The control output of the sticky detector is coupled to the VCA control input for controlling the VCA gain. The detection input of the sticky detector may be coupled to the input signal for generating a feedforward automatic gain control leveler. Alternatively the sticky detector may be coupled to the output signal of the VCA for generating a feedback automatic gain control leveler.

6 Claims, 3 Drawing Sheets

STICKY LEVELER

BACKGROUND OF THE INVENTION

1. Field of the Invention

The present invention generally relates to the field of signal processors. More particularly, the present invention relates to the field of automatic level controllers.

2. Description of the Prior Art

Automatic level controllers, often called "levelers", are used extensively to maintain a relatively constant audio level. A problem with levelers is that compromises exist between keeping the natural sound quality and holding a limited dynamic range. For example, one compromise is the noticeable compression effect on the relatively small level changes of an audio signal while the leveler acts continuously upon the audio program. Levelers are frequently used as pre-processors ahead of other forms of dynamic range control devices such as multiband compressors. Significant improvements in the sound quality could be achieved if the leveler would preserve the relatively small level changes of the audio signal.

It is desirable to provide a sticky leveler to reduce the compromise that exists with levelers between keeping the natural sound quality and holding a limited dynamic range. It is also desirable to provide a sticky leveler which preserves the relatively small level changes of an audio signal.

SUMMARY OF THE INVENTION

The present invention is a sticky leveler utilizing a windowed detection technique to preserve relatively small level changes of an audio signal. The present invention sticky leveler comprises a voltage controlled amplifier (VCA) means and a sticky detector means. Because of the special characteristics of the sticky detector used in conjunction with the VCA, a unique and novel sticky leveler is created with significant differences and advantages over prior art levelers.

An input signal is coupled to the VCA for creating a variable gain path to the VCA output. The sticky detector means receives a detection input and generates a control output. The control output is coupled to the VCA control input for controlling the VCA gain. The detection input of the sticky detector means may be coupled to the input signal for generating a feedforward automatic gain control leveler. Alternatively, the detection input of the sticky detector means may be coupled to the output signal from the VCA for generating a feedback automatic gain control leveler.

It is an object of the present invention to provide a sticky leveler to reduce the compromise that exists with levelers between keeping the natural sound quality and holding a limited dynamic range.

It is a further object of the present invention to provide a sticky leveler which preserves the relatively small level changes of an audio signal.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 2a is a simplified block diagram of the sticky detector of the present invention sticky leveler shown in FIG. 1a;

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Described briefly, the present invention is a sticky leveler comprising a leveling means which utilizes a windowed detection technique to preserve the relatively small level changes of an audio signal as described in detail below.

Figure 1A:
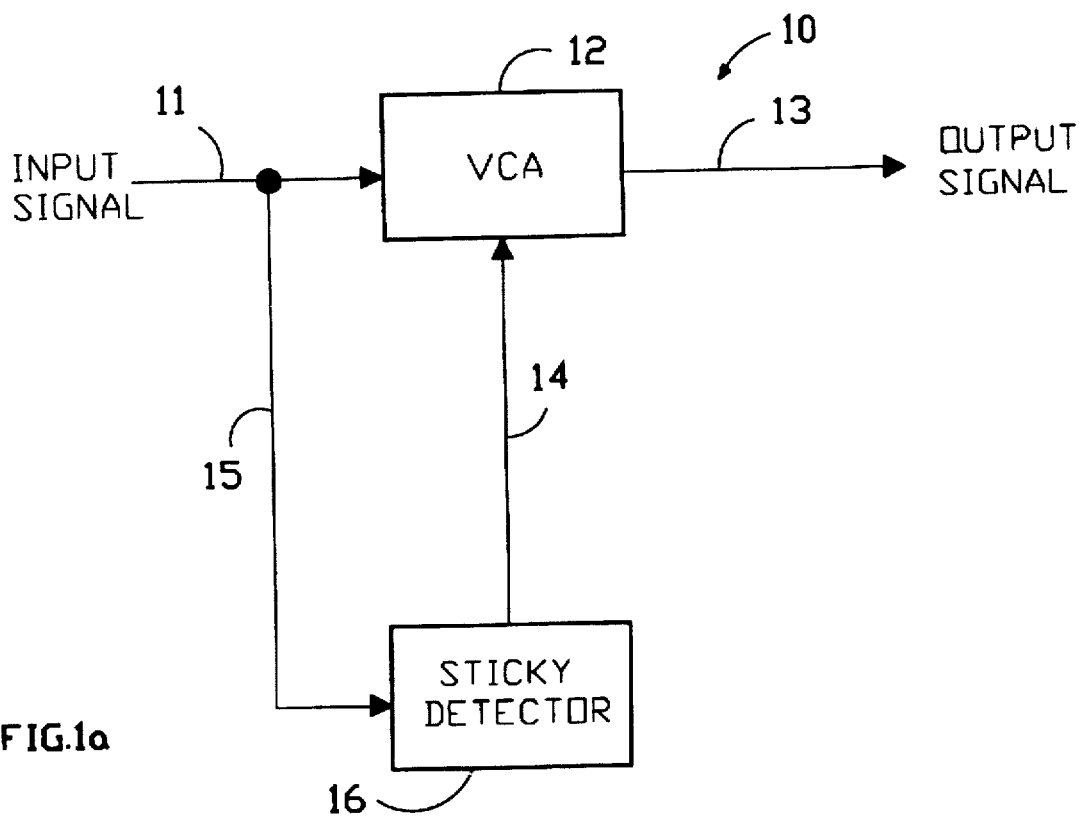
FIG. 1a is a simplified block diagram of the present invention feedforward sticky leveler.
Figure 1B:
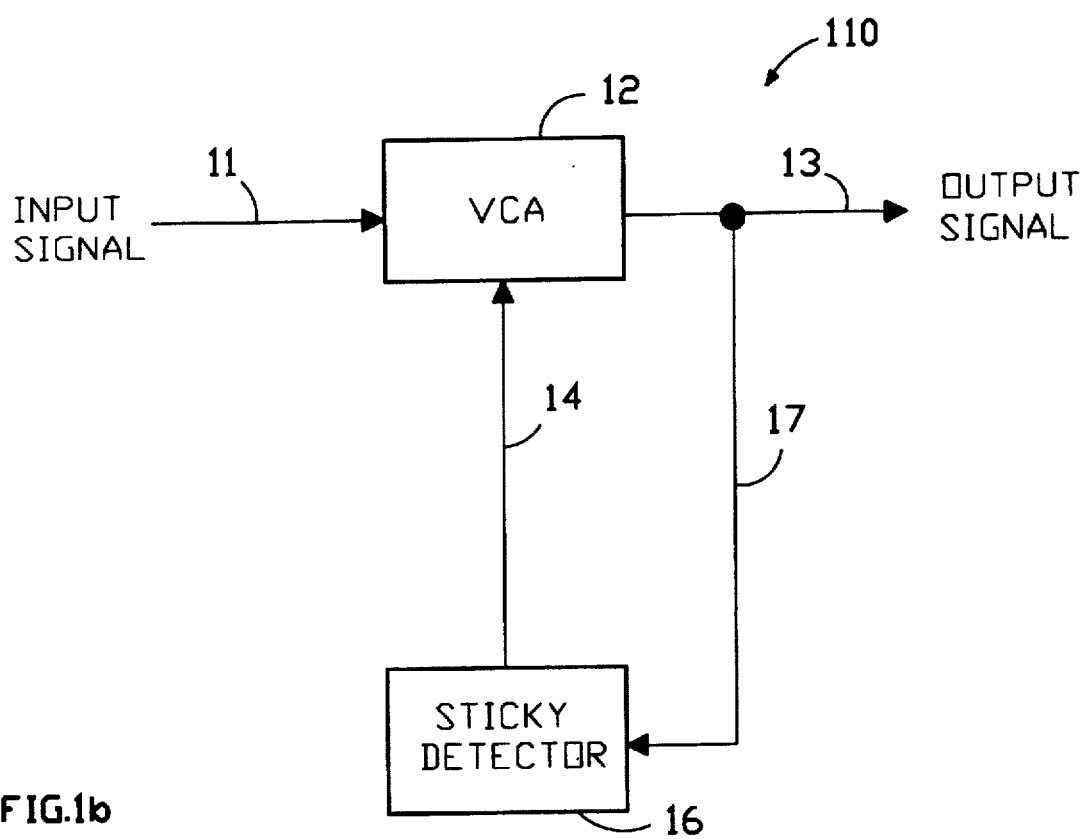
FIG. 1b is a simplified block diagram of the present invention feedback sticky leveler.

Referring to FIGS. 1a and 1b, there are shown a simplified block diagram of the present invention sticky leveler 10. In most respects, the diagrams of FIGS. 1a and 1b are a standard leveling circuit except for the special and unique characteristics of a sticky detector 16. An input signal 11 is coupled to the input of a voltage controlled amplifier (VCA) 12 for creating a variable gain path to the VCA output. By suitably controlling the gain of the VCA 12, it is possible to reduce, in the output signal 13, the variations of level contained in the input signal 11. The sticky detector 16 comprises a detection input and a control output 14. The control output 14 of the sticky detector 16 is coupled to the control input of the VCA 12 for controlling the VCA gain. The detection input of the sticky detector 16 may be coupled to the input signal 11 as depicted by path 15 for producing a feedforward automatic gain control leveler as shown in FIG. 1a. Alternatively the sticky detector 16 may be coupled to the output signal 13 of the VCA 12 as depicted by path 17 for producing a feedback automatic gain control leveler as shown in FIG. 1b. Clearly illustrated is the fact that the present invention applies to both feedforward and feedback leveler methods.

It may be apparent that the diagrams of FIGS. 1a and 1b are generalized configuration for feedback and feedforward automatic gain control devices. However, the unique and novel features of the present invention lie within the sticky detector 16, and, because of the special characteristics of the sticky detector 16 used in conjunction with the VCA 12, a unique and novel sticky leveler 10 according to FIGS. 1a and 1b are created with significant differences and advantages over prior art levelers.

Figure 2A:
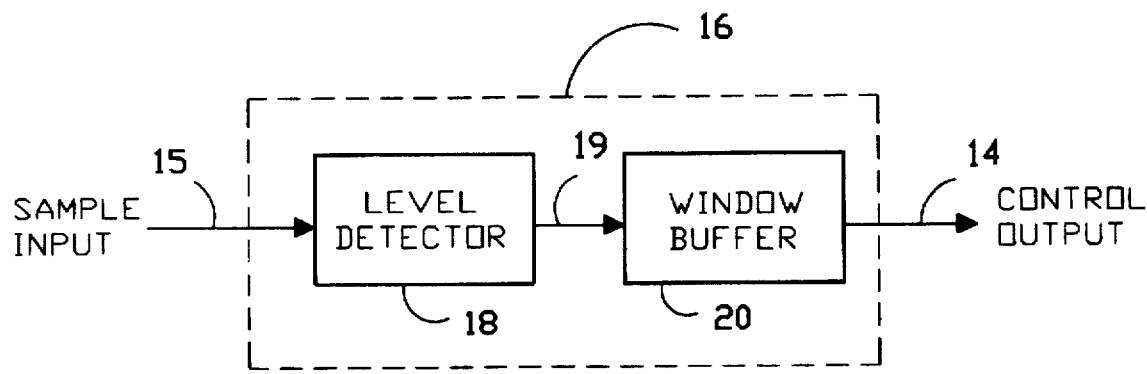
Figure 2B:
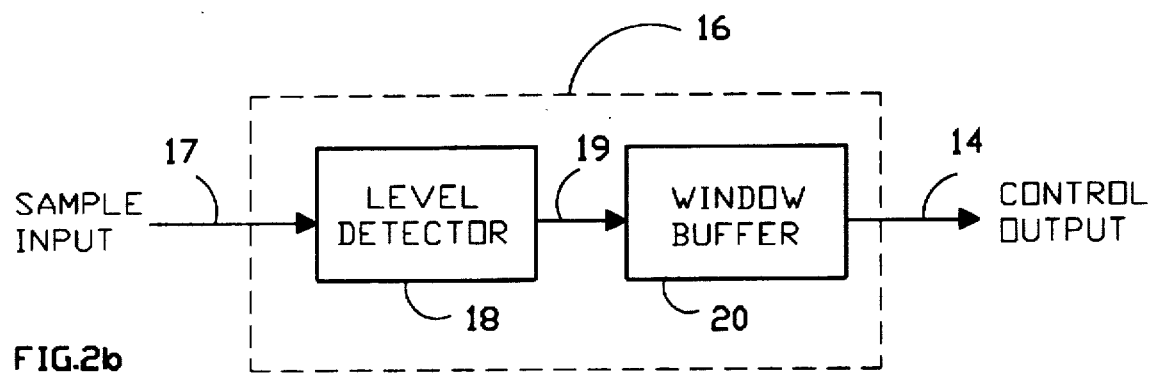
FIG. 2b is a simplified block diagram of the sticky detector of the present invention sticky leveler shown in FIG. 1b.

Referring to FIGS. 2a and 2b, there are shown the sticky detector 16 of the present invention sticky leveler 10. The sticky detector input comprises either path 15 or 17 as shown in FIGS. 1a and 1b respectively as previously described. The input 15 or 17 is coupled to the input of a level detector means 18 for producing a detector output signal 19. The detector output signal 19 represents the level of the detector input signal 15 or 17. The input of a window buffer 20 is coupled to the output of the level detector means 18 to receive the detector output signal 19 for causing a windowed response to the detector output 19.

Figure 3:
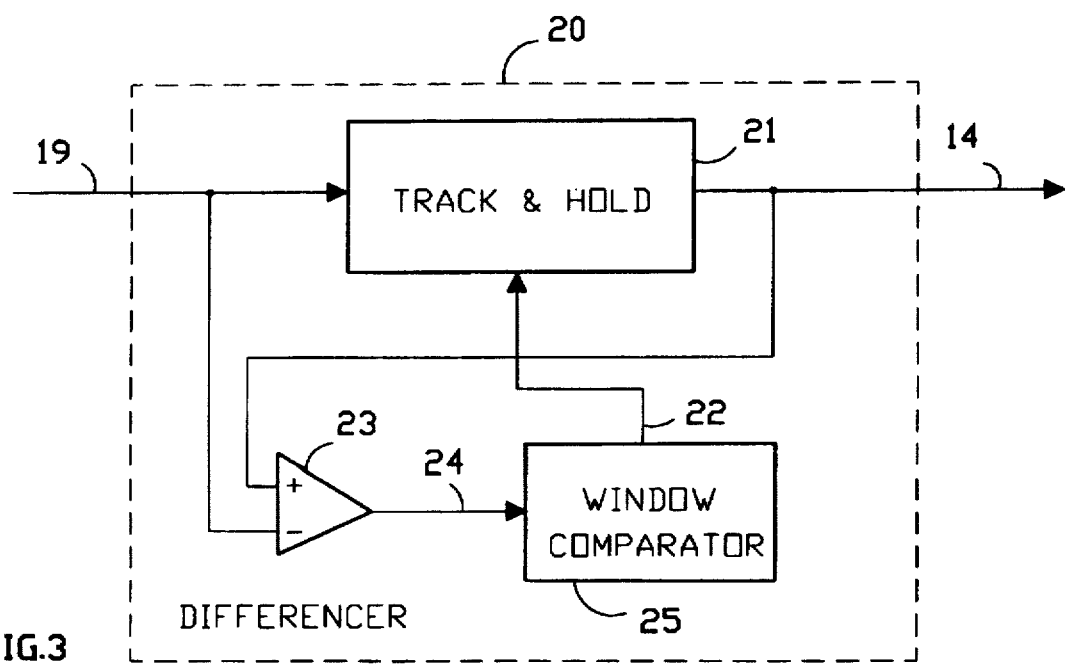
FIG. 3 is a simplified block diagram of the window buffer shown in FIGS. 2a and 2b.

Referring to FIG. 3, there is shown a block diagram of the window buffer 20 of the present invention sticky leveler 10. The detector output signal 19 is coupled to a track and hold circuit 21 for producing an output signal 14 which closely matches the signal 19 whenever the track and hold circuit 21 is "tracking", and to keep the output signal 14 at a constant level equal to the last instant of tracking whenever the track and hold circuit 21 is "holding". It should be readily apparent that this is the description of commonly used circuits also known as a sample and hold circuits. Referring again to FIG. 3, the control input of the track and hold circuit 21 is coupled to the output of a window comparator 25 for causing the track and hold circuit 21 to "track" whenever the output 22 of the window comparator 25 is in a particular state, i.e., either logical high or low, and to "hold" at all other times.

Referring still to FIG. 3, a differencer 23 is coupled both to the input signal 19 and the output signal 14 of the window buffer 20 for producing a difference signal 24 representing the difference between the track and hold input signal 19 and the track and hold output signal 14. If the track and hold circuit 21 is tracking, then the difference signal 24 will always be essentially zero. If the track and hold 21 circuit is holding, then the difference signal 24 may become a negative or a positive magnitude. The difference signal 24 is coupled to the input of the window comparator 25 for causing the window comparator 25 to change output state whenever the positive or negative magnitude of the difference signal 24 exceeds a certain threshold. The output of the window comparator 25 remains in the particular state (logical high or low) which causes the track and hold circuit 21 to "hold" as long as the magnitude of the difference signal 24 remains below the positive and negative thresholds of the window comparator 25. While the track and hold circuit 21 is holding, the VCA gain remains constant, allowing the input signal 11 to pass to the leveler output 13 with no dynamic gain modification. Whenever the difference output signal 24 exceeds one of the window comparator's thresholds, then the track and hold circuit 21 starts to track, causing the VCA 12 to change gain in a corrective sense and thus cause a dynamic level correction to occur at the leveler output 13.

From the forgoing description of present invention sticky leveler 10, it should by now be readily apparent that the action of the window buffer 20 in conjunction with the level detector 18 and the VCA 12 produces an automatic gain controlling leveler wherein the window buffer 20 causes the VCA gain to "stick" to a constant value, even while the detected level may be varying within a relatively small window of magnitude, until a sufficient change occurs in the magnitude of the detected level at which time the VCA gain becomes immediately corrected to bring the detected level back within the small window of magnitude. By this action, relatively small changes of input level, within a sliding window of magnitude, go uncorrected by the sticky leveler of the present invention, while relatively large changes are fully and adequately corrected.

Figure 4:
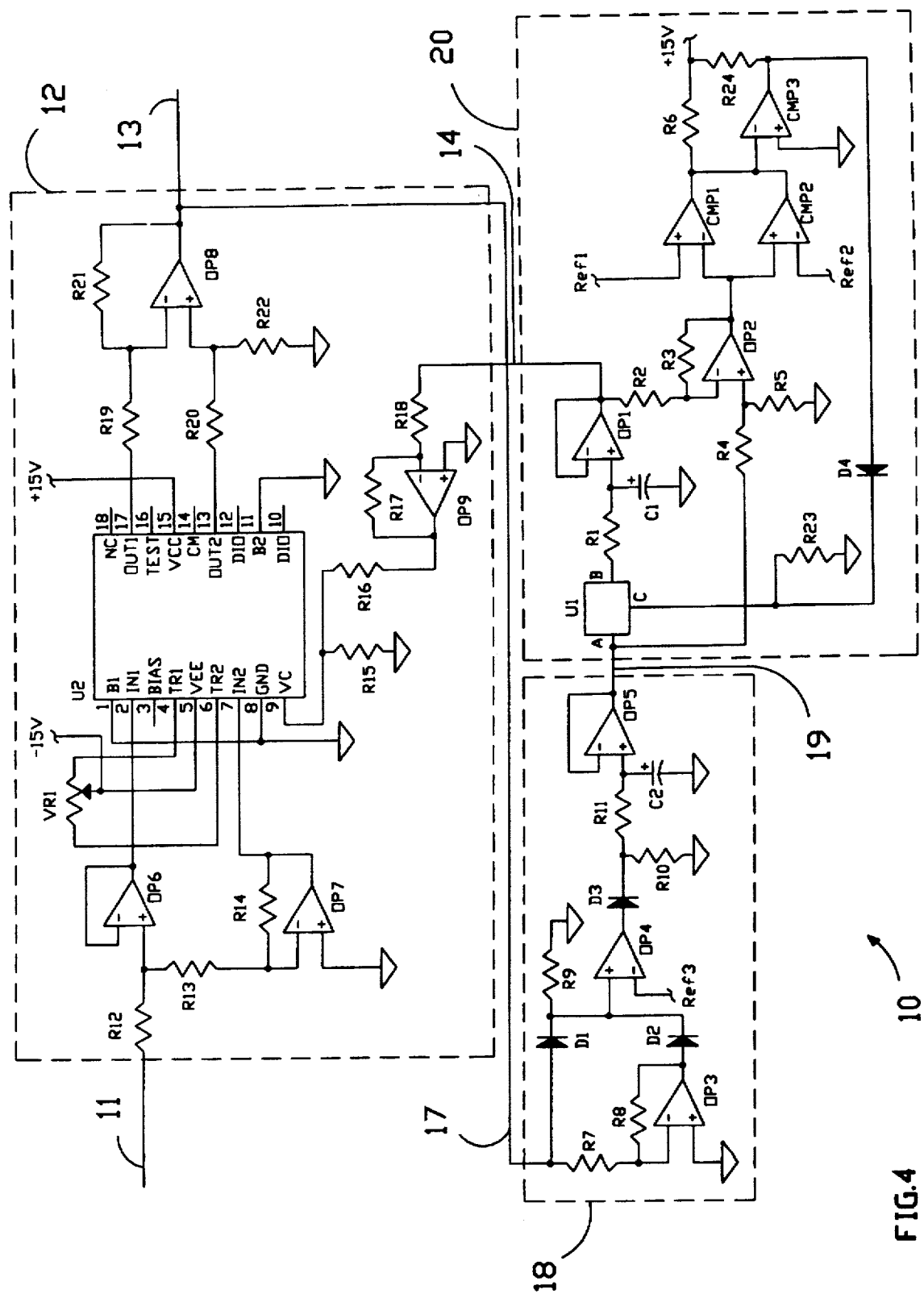
FIG. 4 is a schematic diagram of one of the preferred embodiments of the present invention sticky leveler.

Referring to FIG. 4, there is shown a schematic diagram of the preferred embodiment of the present invention sticky leveler 10. It will be appreciated that the present invention sticky leveler 10 is not limited to circuitry shown in FIG. 4. It is emphasized that while the circuitry shown in FIG. 4 is the preferred embodiment, it is also within the spirit and scope of the present invention to have many circuit variations which can match the basic teachings of the present invention sticky leveler 10.

For convenience in comparing FIG. 4 to the other figures, various circuits have been outlined on FIG. 4 to show the preferred equivalents to the VCA 12, the level detector 18, and the window buffer 20. By way of example only, resistor R1 equals 499Ω; resistors R2, R3, R4, R5, R6, R7, R8, R9, R10, R12, R13, R14, R17, R18, R21, R22, and R24 equal 10KΩ; resistor R11 equals 1MΩ; resistors R19 and R20 equal 4.99KΩ; resistor R15 equals 56Ω; resistor R16 equals 1KΩ; resistor R23 equals 100KΩ; VR1 is a 1KΩ potentiometer; D1, D2, D3, and D4 are 1N914B silicon diodes; C1 and C2 are 2.2 µF tantalum capacitors; OP1, OP2, OP3, OP4, OP5, OP6, OP7, OP8, and OP9 are type LF353 opamps; CMP1, CMP2 and CMP3 are type LM339 comparators; U1 is a CMOS switch CD4016; U2 is an Aphex VCA 1001 integrated circuit; Ref1 equals −0.2 Volts; Ref2 equals +0.2 Volts; and Ref3 equals +0.5 Volts.

The VCA 12 presently preferred is a circuit comprising an Aphex VCA 1001 integrated circuit VCA chip and the support circuitry of four opamps. This VCA circuit 12 includes an input stage comprising OP6 and OP7 which serve to receive a single ended input signal 11 and output two balanced (opposed polarity) signals to the VCA chip U2. This VCA 12 also includes an output stage comprising OP8 as a differential amplifier to receive two balanced signals from the VCA chip U2 and generate the single ended output signal 14. The balanced operation of the VCA chip U2 facilitates cancellation of all VCA control feedthrough from the output signal. The trimmer VR1 serves to provide a control feedthrough null adjustment. The VCA 12 also includes a D.C. inverting amplifier OP9 to suitably adjust the control sensitivity of the VCA 12 and allow a positive polarity control signal to be accepted for controlling the VCA chip U2.

The level detector 18 includes a full wave rectifier comprising OP3, R7, R8, D1 and D2 to generate a rectified version of the VCA output 14. The rectified signal is compared to reference voltage Ref3 by opamp OP4 operating as a comparator. Pulses generated by OP4 are filtered into a D.C. voltage by the pulse integrator comprising R10, R11, and C2. Diode D3 serves to block the negative swing of the output of opamp OP4 thus allowing only a positive polarity d.c. signal to be generated by the pulse integrator. OP5 is a voltage buffer to isolate the pulse integrator from any circuit loading. The window buffer 20 includes a CMOS switch U1 coupled to receive the rectified and filtered D.C. output from OP5. A track and hold circuit comprises U1, R1, C1, and OP1. OP1 is a high input impedance voltage follower which can buffer the D.C. voltage stored by C1 without causing a significant capacitor discharge over a period of several seconds. R1 is simply a small isolation resistor for the benefit of OP5 when the CMOS switch U1 is closed loading the capacitance of C1 onto the output of OP5. The track and hold output of OP1 is coupled to the control input of the VCA 12 to control the VCA gain. In this case, a positive voltage from OP1 will attenuate the VCA 12.

The window buffer 20 also includes a difference amplifier comprising OP2 to generate the difference between the window buffer's input and output signals. The difference signal so generated at the output of OP2 is coupled to a window detector comprising integrated circuit comparators CMP1, CMP2, and CMP3 configured in a classical open collector wired "OR" window comparator circuit where CMP3 is simply a logic inverter. Resistors R6 and R24 serve as open collector pull-ups for the three integrated circuit comparators. The logical outputs of the window comparator are therefore −15 V and +15 V. Diode D4 and resistor R23 serve to block the negative voltage output swing of the window comparator thus presenting the proper logic levels of zero volts and +15 V to the CMOS switch U1.

The CMOS switch U1 control input "c" rests at zero volts until the difference signal from OP2 exceeds the magnitude of either Ref1 or Ref2. This condition forces the CMOS switch U1 to remain open (non-conducting) which represents the "hold" state of the track and hold circuit. Under these circumstances, the VCA gain remains at a constant value.

When the difference output of OP2 exceeds either Ref1 or Ref2 then the window comparator switches output logic state and forces the CMOS switch U1 to close (conducting) and rapidly force the charge of C1 to acquire the output voltage of OP5. This represents the "tracking" state of the track and hold circuit. Under these circumstances the VCA gain moves to a new corrective value.

Eventually, depending on the level variations of the input audio signal, the level detector output stops moving (slewing) or reverses direction. This causes the output of the difference amplifier OP2 to drop below the limits of Ref1 and Ref2, causing CMOS switch U1 to switch open which places the track and hold into the "hold" mode until the level detector's output again exceeds the window comparator's thresholds which places the track and hold again into the "tracking" mode.

Defined in detail, the present invention is a sticky leveler, comprising: (a) a voltage controlled amplifier (VCA) having an audio input for receiving an input signal, an audio output for producing a leveler output signal, and a gain control input; (b) a level detector having an input coupled to the audio output of the VCA for receiving the leveler output signal to detect the level of the leveler output signal, and an output for producing a detector output signal; (c) a track and hold circuit having an input coupled to the output of the level detector for receiving the detector output signal, an output coupled to the gain control input of the VCA for producing a corrective control output signal, and a control input; (d) a differencer having a first input coupled to the output of the level detector for receiving the detector output signal, a second input coupled to the output of the track and hold circuit for receiving the corrective control output signal, and an output for producing a difference output signal representing the difference between the output signal of the level detector and the output signal of the track and hold circuit; and (e) a window comparator having an input coupled to the output of the differencer for receiving the difference output signal and an output coupled to the control input of the track and hold circuit for causing the window comparator to change its output, whereas a positive or negative magnitude of the difference output signal exceeds a certain threshold, the output of the window comparator remains in a particular state causing the track and hold circuit to hold as long as the magnitude of the difference output signal remains within the thresholds of the window comparator and while the track and hold is holding, the VCA gain remains constant, allowing the input signal to pass through the VCA to the output without dynamic gain modification, and whenever the difference output signal exceeds the threshold of the window comparator, the track and hold circuit starts to track, causing the VCA to correct its gain, thereby causing a dynamic level correction to occur at the output of the VCA.

Defined broadly, the present invention is a sticky leveler, comprising: (a) a voltage controlled amplifier (VCA) having an input for receiving an input audio signal, an output for producing a leveler output signal, and a gain control input; (b) a level detector having an input coupled to the output of the VCA for receiving the leveler output signal to detect the level of the leveler output signal, and an output for producing a detector output signal; and (c) a window buffer having an input coupled to the output of the level detector, and an output coupled to the gain control input of the VCA for producing a corrective control output signal to correct the leveler output whenever a present detected input level, by a certain amount exceeds or falls below a detected input level existed at an immediately preceding instance of a gain correction of the VCA.

Defined more broadly, the present invention is a sticky leveler, comprising: (a) a voltage controlled amplifier (VCA) for receiving an input audio signal, an output for producing a leveler output signal, and a gain control input; (b) a sticky detector coupled to the output of the VCA to detect the level of the leveler output signal and producing a corrective control output signal coupled to the gain control input of the VCA; and (c) the sticky detector having means for causing a gain correction of the VCA to correct the leveler output whenever a present detected output level, by a certain amount, exceeds or falls below a detected output level existed at an immediately preceding instance of a gain correction of the VCA.

Alternatively defined in detail, the present invention is a sticky leveler, comprising: (a) a voltage controlled amplifier (VCA) having an audio input for receiving an input signal, an audio output for producing a leveler output signal, and a gain control input; (b) a level detector having an input for also receiving the input signal, and an output for producing a detector output signal representing the level of the input signal; (c) a track and hold circuit having an input coupled to the output of the level detector for receiving the detector output signal, an output coupled to the gain control input of the VCA for producing a corrective control output signal, and a control input; (d) a differencer having a first input coupled to the output of the level detector for receiving the detector output signal, a second input coupled to the output of the track and hold circuit for receiving the corrective control output signal, and an output for producing a difference output signal representing the difference between the output signal of the level detector and the output signal of the track and hold circuit; and (c) a window comparator having an input coupled to the output of the differencer for receiving the difference output signal and an output coupled to the control input of the track and hold circuit for causing the window comparator to change its output, whereas a positive or negative magnitude of the difference output signal exceeds a certain threshold, the output of the window comparator remains in a particular state causing the track and hold circuit to hold as long as the magnitude of the difference output signal remains within the threshold of the window comparator and while the track and hold circuit is holding, the VCA gain remains constant, allowing the input signal to pass through the VCA to the output without dynamic gain modification, and whenever the difference output signal exceeds the threshold of the window comparator, the track and hold circuit starts to track, causing the VCA to correct its gain, thereby causing a dynamic level correction to occur at the output of the VCA.

Alternatively defined broadly, the present invention is a sticky leveler, comprising: (a) a voltage controlled amplifier (VCA) having an input for receiving an input audio signal, an output for producing a leveler output signal, and a gain control input; (b) a level detector having an input for also receiving the input audio signal, and an output for producing a detector output signal; and (c) a window buffer having an input coupled to the output of the level detector, and an output coupled to the gain control input of the VCA for producing a corrective control output signal to correct the leveler output whenever a present detected output level, by a certain amount exceeds or falls below a detected output level existed at an immediately preceding instance of a gain correction of the VCA.

Alternatively defined more broadly, the present invention is a sticky leveler, comprising: (a) a voltage controlled amplifier (VCA) having an input for receiving an input audio signal, an output for producing a leveler output signal, and a gain control input; (b) a sticky detector coupled to the input of the VCA to detect the level of the input audio signal and producing a corrective control output signal coupled to the gain control input of the VCA; and (c) the sticky detector having means for causing a gain correction of the VCA to correct the leveler output whenever a present detected input level, by a certain amount, exceeds or falls below a detected input level existed at an immediately preceding instance of a gain correction of the VCA.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A sticky leveler, comprising:
   a. a voltage controlled amplifier (VCA) having an audio input for receiving an input signal, an audio output for producing a leveler output signal, and a gain control input;
   b. a level detector having an input coupled to said audio output of said VCA for receiving said leveler output signal to detect the level of said leveler output signal, and an output for producing a detector output signal;
   c. a track and hold circuit having an input coupled to said output of said level detector for receiving said detector output signal, an output coupled to said gain control input of said VCA for producing a corrective control output signal, and a control input;
   d. a differencer having a first input coupled to said output of said level detector for receiving said detector output signal, a second input coupled to said output of said track and hold circuit for receiving said corrective control output signal, and an output for producing a difference output signal representing the difference between said output signal of said level detector and said output signal of said track and hold circuit; and
   e. a window comparator having an input coupled to said output of said differencer for receiving said difference output signal and an output coupled to said control input of said track and hold circuit for causing the window comparator to change its output, whereas a positive or negative magnitude of said difference output signal exceeds a certain threshold, the output of the window comparator remains in a particular state causing said track and hold circuit to hold as long as the magnitude of said difference output signal remains within the thresholds of the window comparator and while said track and hold is holding, said VCA gain remains constant, allowing said input signal to pass through said VCA to said output without dynamic gain modification, and whenever said difference output signal exceeds the threshold of the window comparator, said track and hold circuit starts to track, causing said VCA to correct its gain, thereby causing a dynamic level correction to occur at said output of said VCA.

2. A sticky leveler, comprising:
   a. a voltage controlled amplifier (VCA) having an audio input for receiving an input signal, an audio output for producing a leveler output signal, and a gain control input;
   b. a level detector having an input for also receiving said input signal, and an output for producing a detector output signal representing the level of said input signal;
   c. a track and hold circuit having an input coupled to said output of said level detector for receiving said detector output signal, an output coupled to said gain control input of said VCA for producing a corrective control output signal, and a control input;
   d. a differencer having a first input coupled to said output of said level detector for receiving said detector output signal, a second input coupled to said output of said track and hold circuit for receiving said corrective control output signal, and an output for producing a difference output signal representing the difference between said output signal of said level detector and said output signal of said track and hold circuit; and
   e. a window comparator having an input coupled to said output of said differencer for receiving said difference output signal and an output coupled to said control input of said track and hold circuit for causing the window comparator to change its output, whereas a positive or negative magnitude of said difference output signal exceeds a certain threshold, the output of the window comparator remains in a particular state causing said track and hold circuit to hold as long as the magnitude of said difference output signal remains within the threshold of the window comparator and while said track and hold circuit is holding, said VCA gain remains constant, allowing said input signal to pass through said VCA to said output without dynamic gain modification, and whenever said difference output signal exceeds the threshold of the window comparator, said track and hold circuit starts to track, causing said VCA to correct its gain, thereby causing a dynamic level correction to occur at said output of said VCA.

3. A sticky leveler, comprising:
   a. a voltage controlled amplifier (VCA) having an input for receiving an input audio signal, an output for producing a leveler output signal, and a gain control input;
   b. a level detector having an input coupled to said output of said VCA for receiving said leveler output signal to detect the level of said leveler output signal, and an output for producing a detector output signal;
   c. a window buffer having an input coupled to said output of said level detector, and an output coupled to said gain control input of said VCA for producing a corrective control output signal to correct said leveler output whenever a present detected input level, by a certain amount exceeds or falls below a detected input level existed at an immediately preceding instance of a gain correction of said VCA;

d. said window buffer further comprising,
   (i) a track and hold circuit having an input coupled to said output of said level detector for receiving said detector output signal, an output coupled to said gain control input of said VCA for producing said corrective control output signal, and a control input,
   (ii) a differencer having a first input coupled to said output of said level detector for receiving said detector output signal, a second input coupled to said output of said track and hold circuit for receiving said corrective control output signal, and an output for producing a difference output signal representing the difference between said output signal of said level detector and said output signal of said track and hold circuit, and
   (iii) a window comparator having an input coupled to said output of said differencer for receiving said difference output signal and an output coupled to said control input of said track and hold circuit for causing the window comparator to change its output, whereas a positive or negative magnitude of said difference output signal exceeds a certain threshold, the output of the window comparator remains in a particular state causing said track and hold circuit to hold as long as the magnitude of said difference output signal remains within the thresholds of the window comparator and while said track and hold circuit is holding, said VCA gain remains constant, allowing said input signal to pass through said VCA to said output without dynamic gain modification, and whenever said difference output signal exceeds the threshold of the window comparator, said track and hold circuit starts to track, causing said VCA to correct its gain, thereby causing a dynamic level correction to occur at said output of said VCA.

4. A sticky leveler, comprising:
a. a voltage controlled amplifier (VCA) for receiving an input audio signal, an output for producing a leveler output signal, and a gain control input;
b. a sticky detector coupled to said output of said VCA to detect the level of said leveler output signal and producing a corrective control output signal coupled to said gain control input of said VCA;
c. said sticky detector having means for causing a gain correction of said VCA to correct said leveler output whenever a present detected output level, by a certain amount, exceeds or falls below a detected output level existed at an immediately preceding instance of a gain correction of said VCA;
d. said sticky detector further comprising,
   (i) a level detector having an input coupled to said output of said VCA, and an output for producing a detector output signal,
   (ii) a window buffer having an input coupled to said output of said level detector and an output coupled to said gain control input of said VCA;
e. said window buffer further comprising,
   (i) a track and hold having an input coupled to said output of said level detector, an output coupled to said gain control input of said VCA, and a control input,
   (ii) a differencer having a first input coupled to said output of said level detector, a second input coupled to said output of said track and hold, and an output for producing a difference output signal representing the difference between said output signal of said level detector and said output of signal of said track and hold, and
   (iii) a window comparator having an input coupled to said output of said differencer and an output coupled to said control input of said track and hold for causing the window comparator to change its output, whereas a positive or negative magnitude of said difference output signal exceeds a certain threshold, the output of the window comparator remains in a particular state causing said track and hold to hold as long as the magnitude of said difference output signal remains within the threshold of the window comparator and while said track and hold is holding, said VCA gain remains constant, allowing said input signal to pass through said VCA to said output without dynamic gain modification, and whenever said difference output signal exceeds the threshold of the window comparator, said track and hold starts to track, causing said VCA to correct its gain, thereby causing a dynamic level correction to occur at said output of said VCA.

5. A sticky leveler, comprising:
a. a voltage controlled amplifier (VCA) having an input for receiving an input audio signal, an output for producing a leveler output signal, and a gain control input;
b. a level detector having an input for also receiving said input audio signal, and an output for producing a detector output signal;
c. a window buffer having an input coupled to said output of said level detector, and an output coupled to said gain control input of said VCA for producing a corrective control output signal to correct said leveler output whenever a present detected output level, by a certain amount exceeds or falls below a detected output level existed at an immediately preceding instance of a gain correction of said VCA;
d. said window buffer further comprising,
   (i) a track and hold circuit having an input coupled to said output of said level detector for receiving said detector output signal, an output coupled to said gain control input of said VCA for producing said corrective control output signal, and a control input,
   (ii) a differencer having a first input coupled to said output of said level detector for receiving said detector output signal, a second input coupled to said output of said track and hold circuit for receiving said corrective control output signal, and an output for producing a difference output signal representing the difference between said output signal of said level detector and said output signal of said track and hold circuit, and
   (iii) a window comparator having an input coupled to said output of said differencer for receiving said difference output signal and an output coupled to said control input of said track and hold circuit for causing the window comparator to change its output, whereas a positive or negative magnitude of said difference output signal exceeds a certain threshold, the output of the window comparator remains in a particular state causing said track and hold circuit to hold as long as the magnitude of said difference output signal remains within the threshold of the window comparator and while said track and hold circuit is holding, said VCA gain remains constant, allowing said input signal to pass through said VCA to said output without dynamic gain modification, and whenever said difference output signal exceeds the threshold of the window comparator, said track and hold circuit starts to track, causing said VCA to correct its gain, thereby causing a dynamic level correction to occur at said output of said VCA.

6. A sticky leveler, comprising:

a. a voltage controlled amplifier (VCA) having an input for receiving an input audio signal, an output for producing a leveler output signal, and a gain control input;

b. a sticky detector coupled to said input of said VCA to detect the level of said input audio signal and producing a corrective control output signal coupled to said gain control input of said VCA;

c. said sticky detector having means for causing a gain correction of said VCA to correct said leveler output whenever a present detected input level, by a certain amount, exceeds or falls below a detected input level existed at an immediately preceding instance of a gain correction of said VCA;

d. said sticky detector further comprising,
  (i) a level detector having an input coupled to said input of said VCA and an output for producing a detector output signal,
  (ii) a window buffer having an input coupled to said output of said level detector and an output coupled to said gain control input of said VCA;

e. said window buffer further comprising,
  (i) a track and hold having an input coupled to said output of said level detector, an output coupled to said gain control input of said VCA, and a control input,
  (ii) a differencer having a first input coupled to said output of said level detector, a second input coupled to said output of said track and hold, and an output for producing a difference output signal representing the difference between said output signal of said level detector and said output signal of said track and hold, and
  (iii) a window comparator having an input coupled to said output of said differencer, and an output coupled to said control input of said track and hold for causing the window comparator to change its output, whereas a positive or negative magnitude of said difference output signal exceeds a certain threshold, the output of the window comparator remains in a particular state causing said track and hold to hold as long as the magnitude of said difference output signal remains within the threshold of the window comparator and while said track and hold is holding, said VCA gain remains constant, allowing said input signal to pass through said VCA to said output without dynamic gain modification, and whenever said difference output signal exceeds the threshold of the window comparator, said track and hold starts to track, causing said VCA to correct its gain, thereby causing a dynamic level correction to occur at said output of said VCA.

* * * * *